United States Patent
Jeng et al.

(10) Patent No.: US 6,472,717 B1
(45) Date of Patent: Oct. 29, 2002

(54) METHOD FOR FABRICATING REDUCED CONTACTS USING RETARDATION LAYERS

(75) Inventors: Erik S. Jeng, Hsinchu; H. C. Liu, Taipei, both of (TW)

(73) Assignee: Vanguard International Semiconductor Corporation, Hsin-chu (TW)

( * ) Notice: Subject to any disclaimer, the term of this patent is extended or adjusted under 35 U.S.C. 154(b) by 0 days.

(21) Appl. No.: 09/426,691

(22) Filed: Oct. 25, 1999

Related U.S. Application Data

(62) Division of application No. 09/088,442, filed on Jun. 1, 1998, now Pat. No. 5,972,789.

(51) Int. Cl.⁷ .................................................. H01L 31/119
(52) U.S. Cl. ...................... 257/410; 257/758; 257/774; 257/410
(58) Field of Search ................................ 257/774, 758, 257/410, 773, 306, 752, 296; 438/255; 437/52, 60

(56) References Cited

U.S. PATENT DOCUMENTS

| | | | |
|---|---|---|---|
| 5,380,675 A | * 1/1995 | Hsue et al. | 437/52 |
| 5,389,560 A | * 2/1995 | Park | 437/52 |
| 5,422,295 A | * 6/1995 | Choi et al. | 437/52 |
| 5,444,021 A | 8/1995 | Chung et al. | 437/195 |
| 5,482,886 A | 1/1996 | Park et al. | 437/60 |
| 5,492,850 A | 2/1996 | Ryou | 437/52 |
| 5,543,346 A | * 8/1996 | Keum et al. | 438/397 |
| 5,620,917 A | 4/1997 | Yoon et al. | 438/253 |
| 5,663,092 A | 9/1997 | Lee | 438/253 |
| 6,140,180 A | * 10/2000 | Hong | 438/255 |
| 6,140,705 A | * 10/2000 | Liu | 257/774 |

* cited by examiner

*Primary Examiner*—David Nelms
*Assistant Examiner*—Dao Nguyen
(74) *Attorney, Agent, or Firm*—George O. Saile; Stephen B. Ackerman; Rosemary L. S. Pike

(57) ABSTRACT

A new method of forming a contact opening through multiple layers is described. A first dielectric layer is deposited over semiconductor device structures formed in and on a substrate. A patterned conductor layer is formed overlying the first dielectric layer and covered with a second dielectric layer. A retardation layer having a first etch rate is deposited overlying the second dielectric layer. A third dielectric layer having a second etch rate higher than the first etch rate is deposited overlying the retardation layer. A contact opening is etched through the first, second, and third dielectric layers and the retardation layer not covered by a mask to a device structure to be contacted wherein the contact opening through the third dielectric layer is of a first size and wherein the retardation layer is etched at an angle because of the first etch rate slower than the second etch rate and wherein the contact opening through the second and first dielectric layers underlying the angled retardation layer has a second size smaller than the first size thereby completing the formation of a contact opening in the fabrication of an integrated circuit device.

20 Claims, 5 Drawing Sheets

METHOD FOR FABRICATING REDUCED CONTACTS USING RETARDATION LAYERS

This is a division of patent application Ser. No. 09/088,442, filing date Jun. 1, 1998 now U.S. Pat. No. 5,972,789, Method For Fabricating Reduced Contacts Using Retarding Layers, assigned to the same assignee as the present invention.

BACKGROUND OF THE INVENTION (1) Field of the Invention

The invention relates to the fabrication of integrated circuit devices, and more particularly, to a method of reducing the size of contacts using a retardation layer in the fabrication of integrated circuit devices.

(2) Description of the Prior Art

In the fabrication of integrated circuit devices, feature size has been decreasing. As the design rule decreases, the size of contact holes also decreases. Additionally, the aspect ratio of contact holes has become higher. Contact holes typically pass through multiple conductor layer regions, such as word line and bit line regions, as well as their intervening insulation regions. The increased aspect ratio makes it difficult to fabricate contact holes using conventional lithography techniques without misaligning the holes with respect to the existing device structure. Several techniques, such as tapered contacts and self-aligned contacts, have been proposed for future applications. However, the multi-level contact was found to be much more difficult and complicated than single level contacts even with the tapered or self-aligned contact technologies.

FIG. 1 illustrates such a tapered contact technique. Semiconductor device structures such as gate electrodes 18 have been formed on the surface of the semiconductor substrate 10. Conductors 30 and 40 have been formed on various levels overlying the gate electrodes. Multiple insulating layers comprising borophosphosilicate glass (BPSG), phosphosilicate glass (PSG), silicon oxide, or the like, 60 are formed over and under the conductors. A photoresist mask 80 is formed over the top surface of the insulating layers. The opening A in the photoresist mask is larger than the opening B at the bottom of the contact opening 90. This is a tapered contact opening. However, because of the many layers through which the contact opening is to be made, it is very difficult to avoid the conductors 30 and 40 within the layers. A line short may occur at 95 where a conductor is exposed or very nearly exposed. When the contact opening 90 is filled with a conducting material, a short will occur at 95, leading to device failure.

U.S. Pat. No. 5,663,092 to Lee teaches forming a silicon nitride cap on the top and sidewalls of the conductors. The cap etches more slowly than the insulating layers thus preventing the exposure of the conductors in etching a contact opening. U.S. Pat. No. 5,444,021 to Chung et al teaches exposing and etching away a portion of the topmost conductors, forming oxide spacers on the sidewalls of the conductors to narrow the opening, and then continuing the contact hole etch. U.S. Pat. Nos. 5,389,560 to Park, U.S. Pat. No. 5,492,850 to Ryou, and U.S. Pat. No. 5,482,886 to Park et al all teach methods of partially etching a contact opening, then forming sidewall spacers of polysilicon or oxide to narrow the opening, and then continuing the contact opening etch. U.S. Pat. No. 5,620,917 to Yoon shows a method of making contact openings and capacitors.

SUMMARY OF THE INVENTION

Accordingly, it is a principal object of the invention to provide an effective and very manufacturable method of forming a contact opening in the fabrication of integrated circuit devices.

Another object of this invention is to provide a method for formation of a contact opening through a multiple layer structure.

Yet another object of the invention is to form a contact opening having a high aspect ratio.

Yet another object is to widen the process window and relax control on photolithographic alignment and critical dimension in forming a contact opening through multiple layers.

A still further object of the invention is to widen the process window and relax control on photolithographic alignment and critical dimension in forming a contact opening through multiple layers by forming a retardation layer between two adjacent dielectric layers.

In accordance with these objects of this invention, a new method of forming a contact opening through multiple layers by forming a retardation layer between two adjacent dielectric layers is achieved. Semiconductor device structures are provided in and on a semiconductor substrate. A first dielectric layer is deposited over the semiconductor device structures. A patterned conductor layer is formed overlying the first dielectric layer. A second dielectric layer is deposited overlying the patterned conductor layer. A retardation layer is deposited overlying the second dielectric layer wherein the retardation layer has a first etch rate. A third dielectric layer is deposited overlying the retardation layer wherein the third dielectric layer has a second etch rate higher than the first etch rate. A mask is formed over the third dielectric layer having an opening of a first size above one of the semiconductor device structures to be electrically contacted. A contact opening is etched through the first, second, and third dielectric layers and the retardation layer not covered by the mask to the semiconductor device structures to be electrically contacted wherein the contact opening through the third dielectric layer is of the first size and wherein the retardation layer is etched at an angle because of the first etch rate slower than the second etch rate and wherein the contact opening through the second and first dielectric layers underlying the angled retardation layer has a second size smaller than the first size thereby completing the formation of a contact opening in the fabrication of an integrated circuit device.

Also, in accordance with the objects of the invention, an integrated circuit device is described. Semiconductor device structures lie in and on a semiconductor substrate. A first dielectric layer overlies the semiconductor device structures. A first patterned conductor layer overlies the first dielectric layer. A second dielectric layer overlies the first patterned conductor layer. A retardation layer overlies the second dielectric layer. A third dielectric layer overlies the retardation layer. A second conductor layer lies within a contact opening through the first, second, and third dielectric layers and the retardation layer wherein the second conducting layer electrically contacts one of the semiconductor device structures wherein the contact opening through the third dielectric layer is of a first size and wherein the retardation layer has been etched at an angle and wherein the contact opening through the second and first dielectric layers underlying the angled retardation layer has a second size smaller than the first size completing the integrated circuit device.

BRIEF DESCRIPTION OF THE DRAWINGS

In the accompanying drawings forming a material part of this description, there is shown.

DESCRIPTION OF THE PREFERRED EMBODIMENTS

Figure 1:
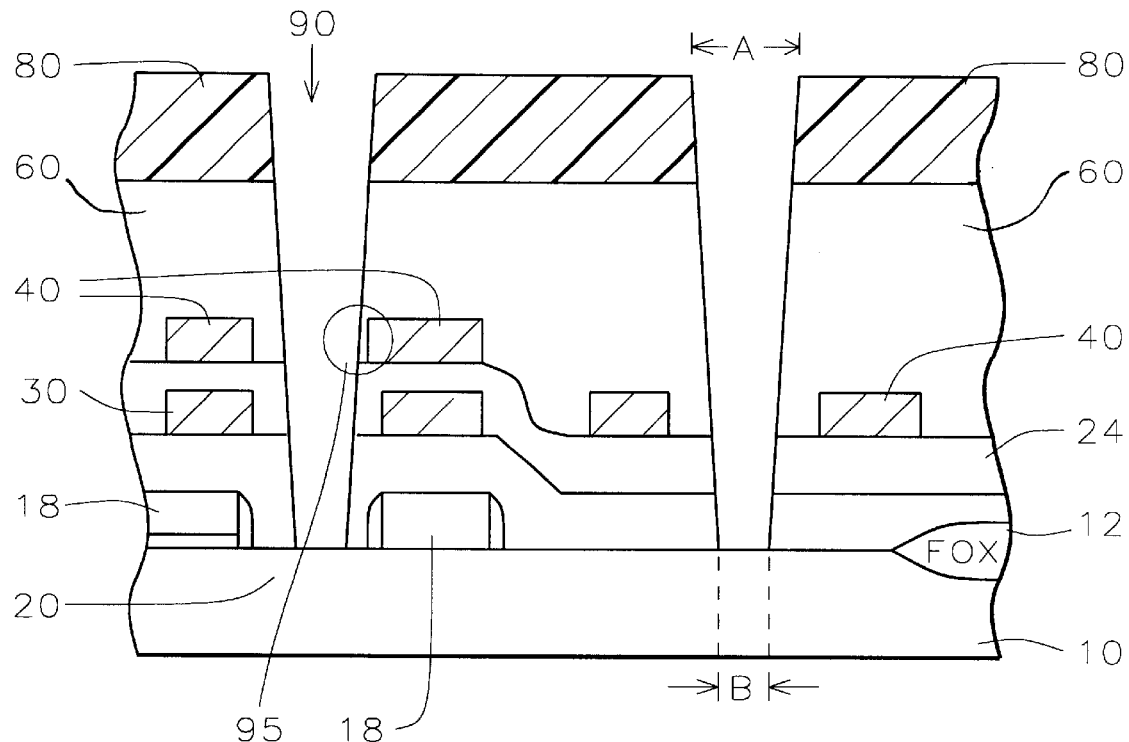
FIG. 1 schematically illustrates in cross-sectional representation a tapered contact openings of the prior art.

Referring now more particularly to FIGS. 2–8, there is shown a schematic cross-sectional representation of a partially completed integrated circuit device. The drawing figures illustrate an N-channel MOSFET integrated circuit device. However, it is well understood by those skilled in the art that a P-channel FET integrated circuit device could be formed by simply substituting opposite polarities to those given for the N-channel embodiment. Also, in a similar way, a CMOSFET could be formed by making both N channel and P channel devices upon the same substrate. Furthermore, it should be understood that the invention is not limited to the MOSFET embodiment illustrated in the figures, but can be used in the manufacture of any integrated circuit device in which a contact or via opening is to be made through a multiple layer structure.

Figure 2:
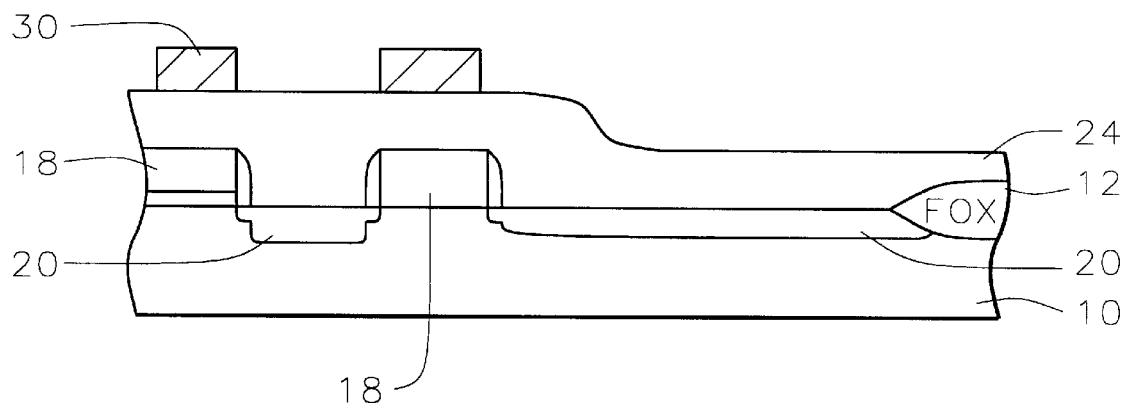
FIGS. 2 through 8 schematically illustrate in cross-sectional representation a method of forming an improved contact opening according to a preferred embodiment of the present invention.

Referring now more particularly to FIG. 2, there is illustrated a monocrystalline silicon semiconductor substrate 10. Field OXide regions 12, gate electrodes 18, and source and drain regions 20 have been formed in and on the semiconductor substrate as is conventional in the art.

Next, a first dielectric layer is deposited overlying the semiconductor device structures. The layer may be composed of borophosphosilicate glass (BPSG), phosphosilicate glass (PSG), tetraethoxysilane (TEOS) oxide, borophospho-TEOS (BPTEOS), or the like. The first insulating layer 24 has a thickness of between about 4000 to 10,000 Angstroms. It should be understood that this first dielectric layer 24 may actually be composed of multiple layers itself.

A conducting layer, comprising polysilicon or a metal such as tungsten, or aluminum, or the like is deposited over the dielectric layer and through contact openings (not shown) to form electrical connections as required. The conducting layer is patterned to form conducting lines 30, as shown in FIG. 2. These conductors 30 may be word lines or bit lines.

Figure 3:
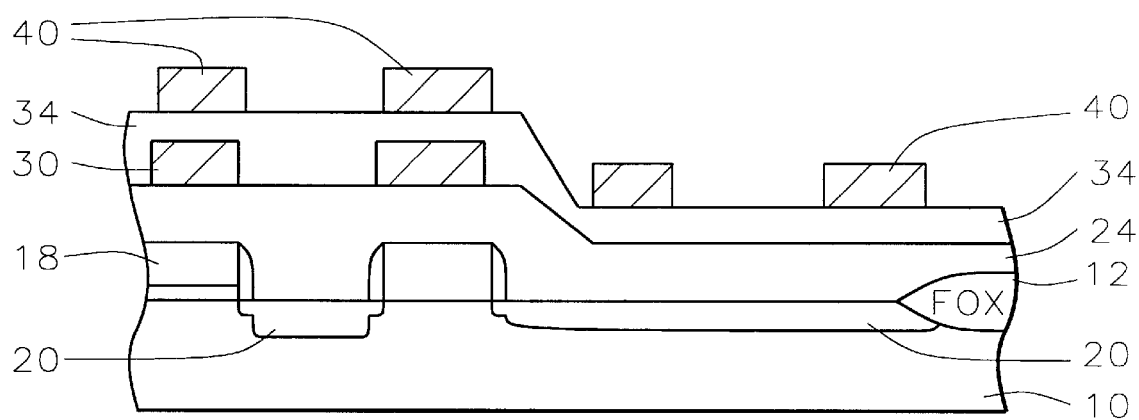

Referring now to FIG. 3, an insulating layer 34 is deposited over the conductors to a thickness of between about 4000 and 10,000 Angstroms. This insulating layer may have the same composition as the first insulating layer 24 and may also comprise a multiple layers.

A second conducting layer, comprising polysilicon or a metal such as tungsten, or aluminum, or the like is deposited over the insulating layer 34 and through contact openings (not shown) to form electrical connections as required. The conducting layer is patterned to form conducting lines 40, as shown in FIG. 3. These conductors 40 may be word lines or bit lines.

Figure 4:
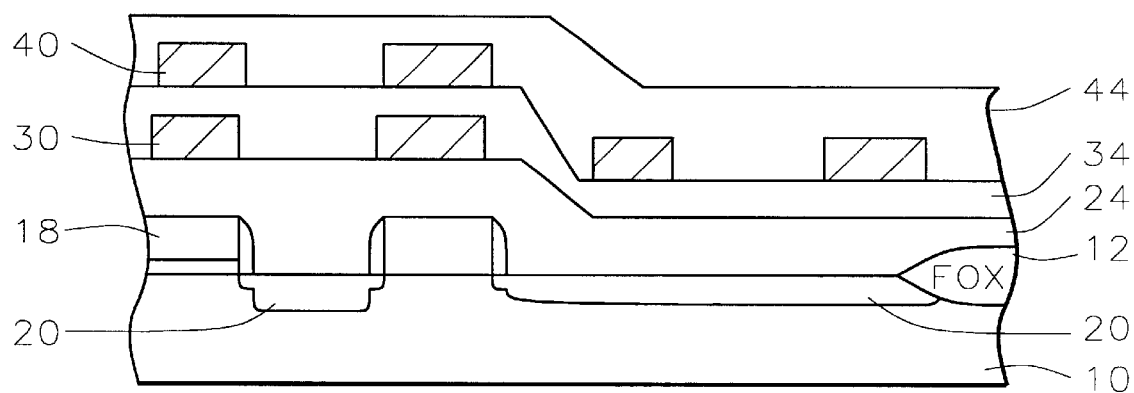

Referring now to FIG. 4, an insulating layer 44 is deposited over the conductors to a thickness of between about 4000 and 10,000 Angstroms. This insulating layer may have the same composition as the first and second insulating layers 24 and 34.

Figure 5:
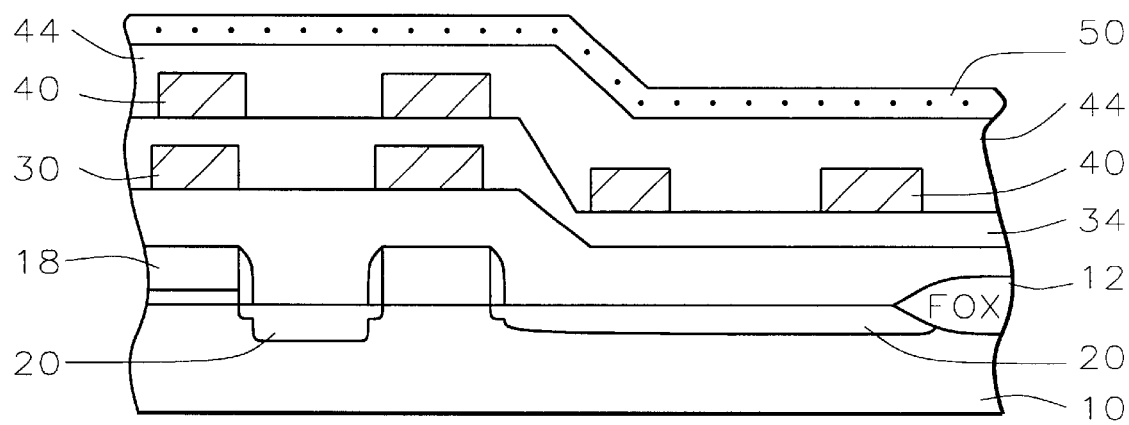

Referring now to FIG. 5, retardation layer 50 is deposited over the insulating layers 44 and 34 to protect the underlying conductors 30 and 40. The retardation layer is used to effect contact tapering and is used above conductors where a narrower contact opening is required to prevent a short. Therefore, the contact size can be reduced by the predetermined taper angle and the thickness of the retardation layer. The retardation layer 50 can be chosen from various dielectric materials such as silicon nitride deposited by plasma-enhanced chemical vapor deposition (PECVD), low pressure chemical vapor deposition (LPCVD), or high density plasma chemical vapor deposition (HDP CVD) or silicon dioxide deposited by PECVD or HDP CVD. The retardation material must be chosen so that it has a slower etch rate than the insulating layers above it. The thickness of the retardation layer should be between about 500 and 2000 Angstroms.

Figure 6:
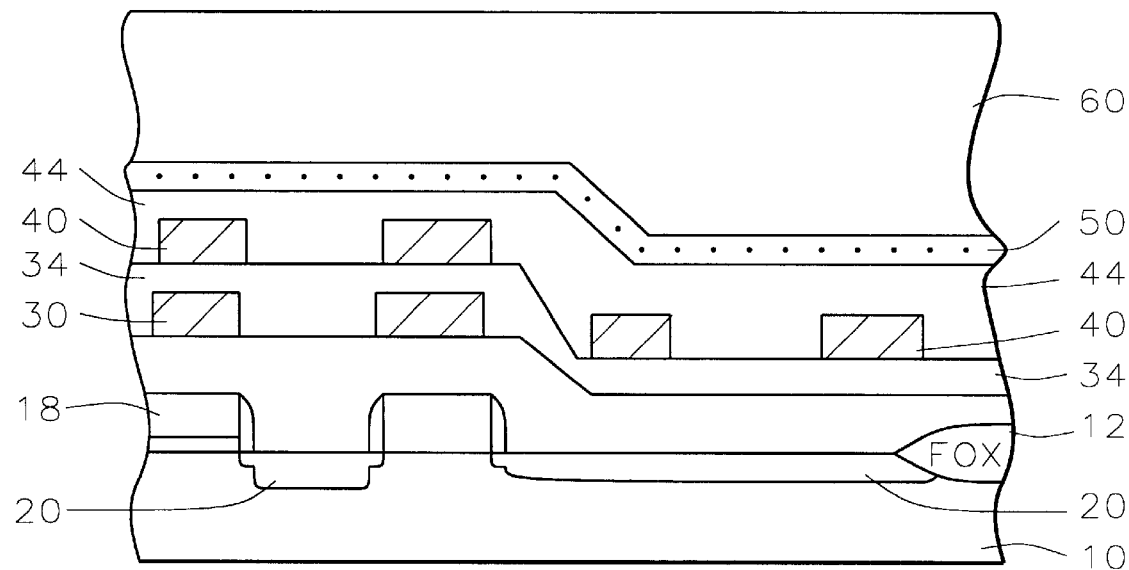

A final dielectric layer 60 is deposited over the retardation layer, as shown in FIG. 6. This dielectric layer 60 may comprise multiple layers and has a thickness of between about 4000 and 15,000 Angstroms.

Figure 7:
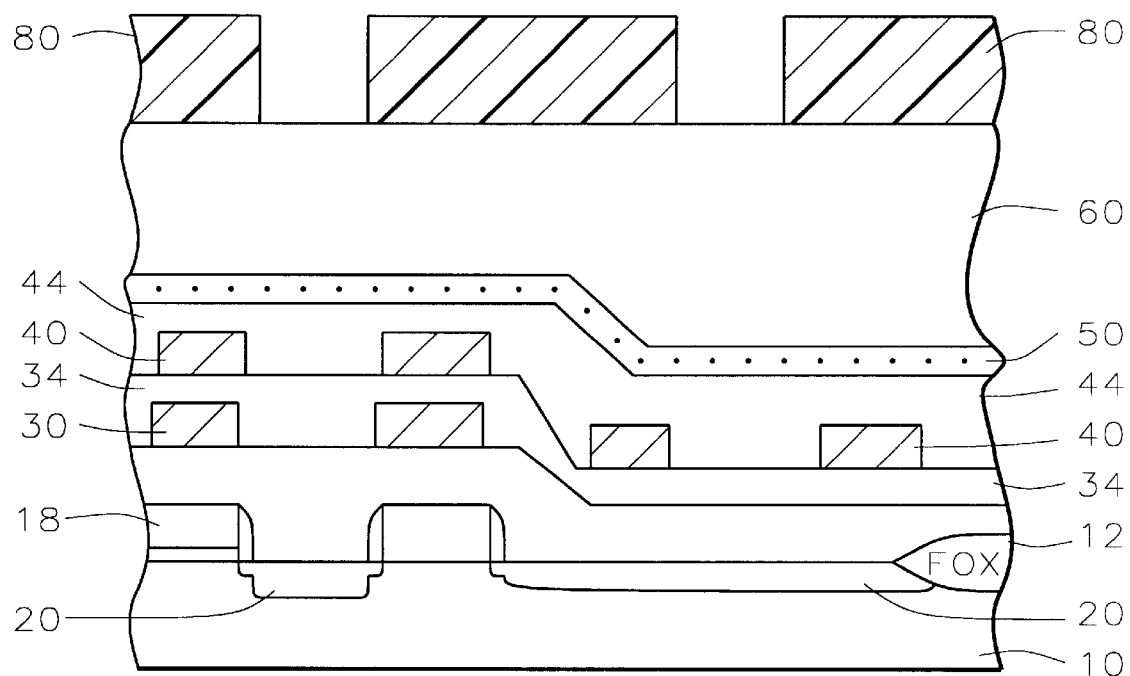

The contact or via openings are now formed through the insulating layer structure, for example, to the source/drain regions 20. Referring to FIG. 7, a photoresist mask 80 is formed by lithography and etching techniques over the insulating layer structure to provide openings over the device elements to be electrically contacted.

The contact opening is etched through the multiple layers using a dry etch. For example, a plasma comprising $CF_4/CHF_3/Ar/O_2$ gases, $C_4F_8/CH_3F/CO/O_2/Ar$ gases, or $C_4F_8/CF_4/Ar/N_2/CH_3F/CO$ gases may be used. These etchants provide for a minimal taper angle in the majority of dielectrics and a controllable taper angle in the retardation layer.

Figure 8:
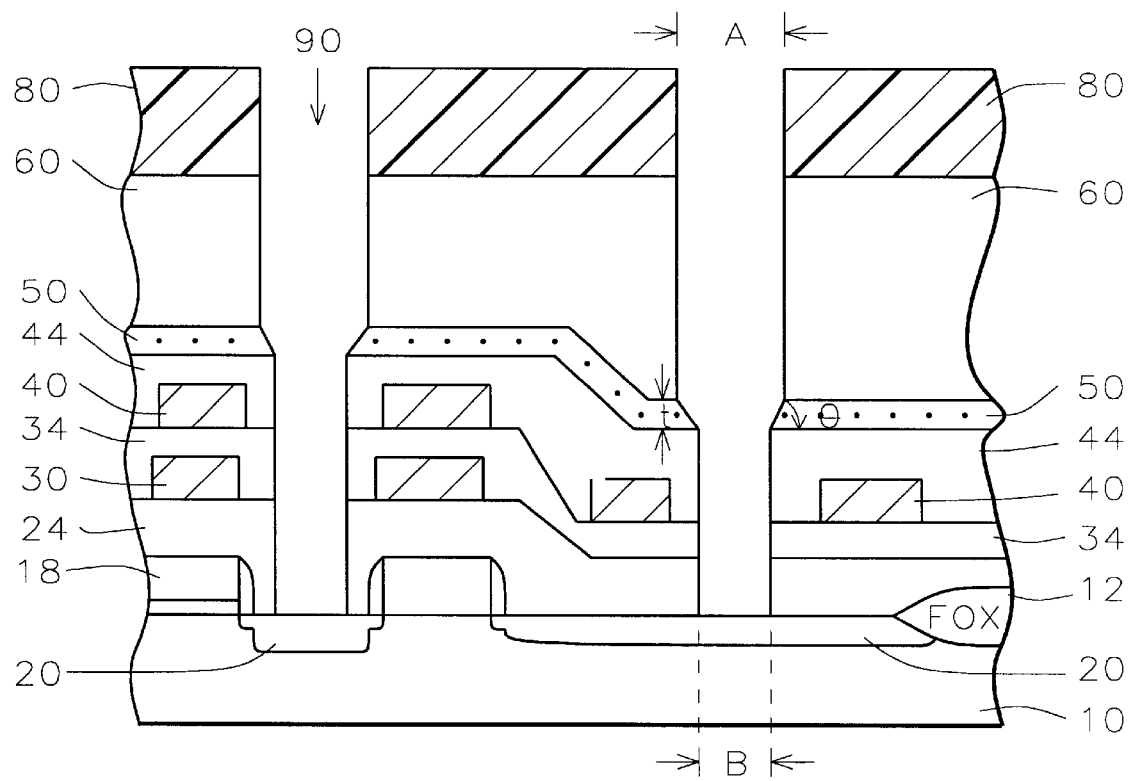

As illustrated in FIG. 8, since the retardation layer etches more slowly than the other dielectric layers, the retardation layer 50 is tapered and the contact opening beneath the retardation layer is narrower than the opening above. That is, the size B of the opening 90 below the retardation layer is smaller than the size A of the opening above the retardation layer. The thickness T of the retardation layer and the taper angle 9 can be controlled by using different gas ratios. By controlling the thickness T and the taper angle θ, the contact opening size A can be reduced to B by the following equation:

$$B = A - 2 \times (\cotan \theta) \times T$$

The conductors 30 and 40 within the dielectric layers will not be exposed within the contact opening; thereby shorts are prevented.

Processing continues as is conventional in the art to fill the contact openings with a conducting material. For example, if the integrated circuit device to be formed is a memory device, capacitors may be formed within the contact openings by depositing and patterning a first layer of polysilicon 92, depositing a capacitor dielectric layer 94, and depositing and patterning a second layer of polysilicon 96 to complete formation of the capacitors, as illustrated in FIG. 9.

The process of the present invention is a simple and very manufacturable method for widening the process windows and relaxing control on photolithographic alignment and critical dimension in forming high aspect ratio contact openings. The addition of a retardation layer between two adjacent dielectric layers in the areas where a narrower contact opening is required to avoid a short is a simple and effective process step. The composition and thickness of the retardation layer can be chosen to provide the desired reduction in contact opening size, based upon the predetermined taper angle of the retardation layer material. The usage of the retardation layer provides a tapered contact that is less sensitive to topography than conventional tapered contacts.

Figure 9:
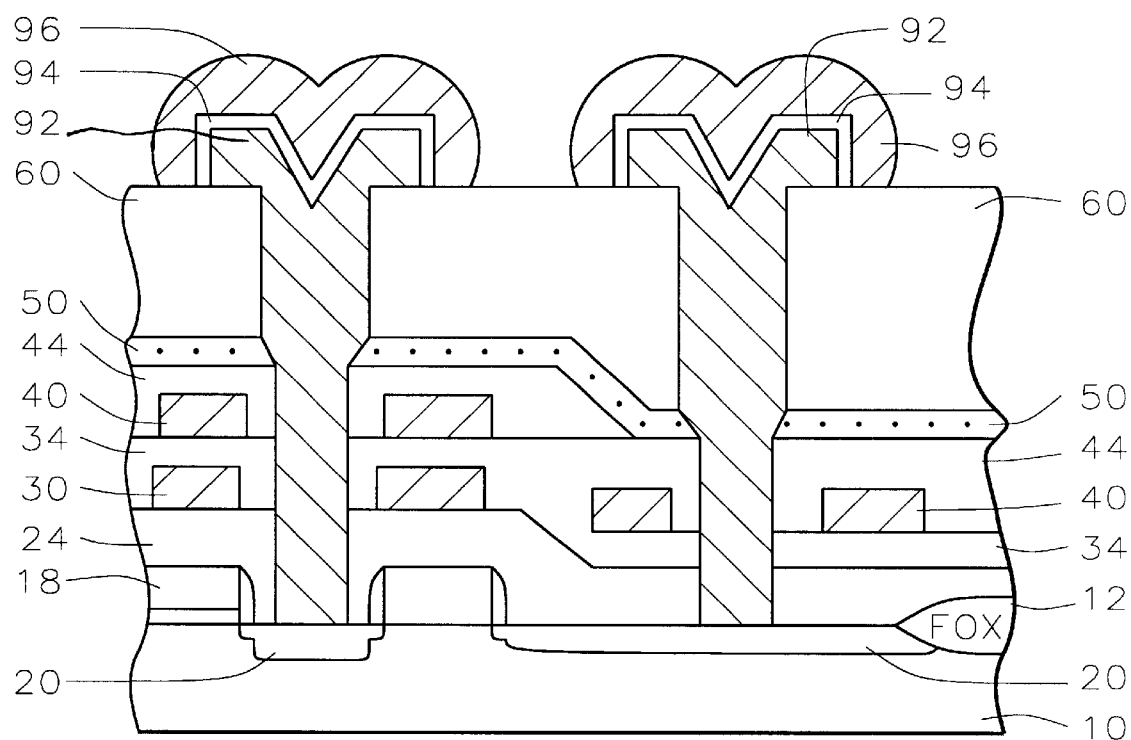
FIG. 9 schematically illustrates in cross-sectional representation a completed integrated circuit device fabricated by the process of the present invention.

FIG. 9 illustrates an integrated circuit device of the present invention. The device illustrated is a memory device including a capacitor structure. It is to be understood that the integrated circuit device of the invention may be any device in which there is a contact or via opening made through a multiple layer structure. Semiconductor device structures, including gate electrodes 18 and source and drain regions 20, lie in and on the semiconductor substrate 10. A first dielectric layer 24 overlies the semiconductor device structures. A first patterned conductor layer 30 overlies the first dielectric layer 24. A second dielectric layer 34 overlies the first patterned conductor layer. The patterned conductor layer and overlying dielectric layer may be repeated as often as desired. For example, a conducting layer 40 and overlying dielectric layer 44 are illustrated in the figure. A retardation layer 50 overlies the topmost second dielectric layer 44. A third dielectric layer 60 overlies the retardation layer. A second conductor layer 92 lies within a contact opening through the first, second, and third dielectric layers and the retardation layer wherein the second conducting layer electrically contacts one of the semiconductor device structures 20 wherein the contact opening through the third dielectric layer is of a first size and wherein the retardation layer has been etched at an angle and wherein the contact opening through the second and first dielectric layers underlying the angled retardation layer has a second size smaller than the first size. The memory device of the example is completed by forming the capacitor dielectric layer 94 and the upper plate electrode 96 of the capacitor.

The integrated circuit device of the invention has a high aspect ratio contact opening through multiple dielectric layers. The presence of the retardation layer above the conductors is used to reduce the size of the contact opening and so to prevent a short.

While the invention has been particularly shown and described with reference to the preferred embodiments thereof, it will be understood by those skilled in the art that various changes in form and details may be made without departing from the spirit and scope of the invention.

What is claimed is:

1. An integrated circuit device comprising:
   semiconductor device structures in and on a semiconductor substrate wherein said semiconductor device structures include gate electrodes and associated source/drain regions and a capacitor node contact of a memory device;
   a first dielectric layer overlying said semiconductor device structures;
   a first patterned conductor layer overlying said first dielectric layer;
   a second dielectric layer overlying said first patterned conductor layer;
   a retardation layer overlying said second dielectric layer;
   a third dielectric layer overlying said retardation layer; and
   a second conducting layer within a contact opening through said first, second, and third dielectric layers and said retardation layer wherein said second conducting layer forms the bottom plate of a capacitor and electrically contacts said capacitor node contact wherein said contact opening through said third dielectric layer is of a first size and wherein said retardation layer has been etched at an angle and wherein said contact opening through said second and first dielectric layers underlying said angled retardation layer has a second size smaller than said first size completing the fabrication of said integrated circuit device.

2. The device according to claim 1 further comprising forming a capacitor dielectric layer overlying said second conducting layer and forming a third conducting layer overlying said capacitor dielectric layer to form an upper electrode of said capacitor.

3. The device according to claim 1 wherein said first, second, and third dielectric layers comprise one of the group containing borophosphosilicate glass (BPSG), phosphosilicate glass (PSG), borophospho-tetraethoxysilane oxide (BPTEOS), and silicon dioxide.

4. The device according to claim 1 wherein said retardation layer has an etch rate lower than an etch rate of said third dielectric layer.

5. The device according to claim 1 wherein said retardation layer has an etch rate lower than an etch rate of said third dielectric layer and wherein said retardation layer is selected from the group consisting of silicon nitride and silicon dioxide.

6. The device according to claim 1 further comprising:
   a third dielectric layer overlying said first patterned conductor layer; and
   a second patterned conductor layer overlying said third dielectric layer and underlying said second dielectric layer.

7. The device according to claim 1 wherein said retardation layer has a thickness of between about 500 and 2000 Angstroms.

8. The device according to claim 1 wherein said second dielectric layer has a thickness of between about 4000 and 10,000 Angstroms.

9. An integrated circuit device comprising:
   semiconductor device structures in and on a semiconductor substrate wherein said semiconductor device structures include gate electrodes and associated source/drain regions;
   a first dielectric layer overlying said semiconductor device structures;
   a first patterned conductor layer overlying said first dielectric layer;
   a second dielectric layer having a thickness of between 4000 and 10,000 Angstroms overlying said first patterned conductor layer;
   a retardation layer overlying said second dielectric layer;
   a third dielectric layer overlying said retardation layers and
   a second conducting layer within a contact opening through said first, second, and third dielectric layers and said retardation layer wherein said second conducting layer electrically contacts one of said source/drain regions wherein said contact opening through said third dielectric layer is of a first size and wherein said retardation layer has been etched at an angle and wherein said contact opening through said second and first dielectric layers underlying said angled retardation layer has a second size smaller than said first size completing the fabrication of said integrated circuit device.

10. The device according to claim 9 further comprising:
    a third dielectric layer overlying said first patterned conductor layer; and
    a second patterned conductor layer overlying said third dielectric layer and underlying said second dielectric layer.

11. The device according to claim 9 wherein said first, second, and third dielectric layers comprise one of the group containing borophosphosilicate glass (BPSG), phosphosilicate glass (PSG), borophospho-tetraethoxysilane oxide (BPTEOS), and silicon dioxide.

12. The device according to claim 9 wherein said retardation layer has an etch rate lower than an etch rate of said third dielectric layer.

13. The device according to claim 9 wherein said retardation layer has an etch rate lower than an etch rate of said third dielectric layer and wherein said retardation layer is selected from the group consisting of silicon nitride and silicon dioxide.

14. The device according to claim 9 wherein said retardation layer has a thickness of between about 500 and 2000 Angstroms.

15. An integrated circuit device comprising:

semiconductor device structures in and on a semiconductor substrate;

a first dielectric layer overlying said semiconductor device structures;

a first patterned conductor layer overlying said first dielectric layer;

a second dielectric layer overlying said first patterned conductor layer;

a second patterned conductor layer overlying said second dielectric layer;

a third dielectric layer overlying said second patterned conductor layer;

a retardation layer overlying said third dielectric layer wherein said retardation layer has a thickness of between about 500 and 2000 Angstroms;

a fourth dielectric layer overlying said retardation layer wherein said retardation layer has an etch rate slower than an etch rate of said fourth dielectric layer; and a third conducting layer within a contact opening through said first, second, third, and fourth dielectric layers and said retardation layer wherein said third conducting layer electrically contacts one of said semiconductor device structures wherein said contact opening through said fourth dielectric layer is of a first size and wherein said retardation layer has been etched at an angle and wherein said contact opening through said third, second and first dielectric layers underlying said angled retardation layer has a second size smaller than said first size completing the fabrication of said integrated circuit device.

16. The device according to claim 15 wherein said first, second, third, and fourth dielectric layers comprise one of the group containing borophosphosilicate glass (BPSG), phosphosilicate glass (PSG), borophospho-tetraethoxysilane oxide (PPTEOS), and silicon dioxide.

17. The device according to claim 15 wherein said retardation layer comprises silicon nitride.

18. The device according to claim 15 wherein said retardation layer comprises silicon dioxide.

19. The device according to claim 15 wherein said second dielectric layer has a thickness of between about 4000 and 10,000 Angstroms.

20. The device according to claim 15 wherein said one of said semiconductor device structures to be electrically contacted is a source/drain region of a CMOS integrated circuit device.

* * * * *